United States Patent
Huang et al.

(10) Patent No.: US 9,147,035 B1
(45) Date of Patent: Sep. 29, 2015

(54) VERIFYING METHOD OF OPTICAL PROXIMITY CORRECTION

(71) Applicant: UNITED MICROELECTRONICS CORP., Hsinchu (TW)

(72) Inventors: Kuo-Hsun Huang, Miaoli County (TW); Chao-Yao Chiang, Hsinchu (TW); Chien-Hung Chen, Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/533,471

(22) Filed: Nov. 5, 2014

(30) Foreign Application Priority Data

Sep. 16, 2014 (TW) .............................. 103131874 A

(51) Int. Cl.
  *G06F 17/50* (2006.01)
(52) U.S. Cl.
  CPC .................................. *G06F 17/5081* (2013.01)
(58) Field of Classification Search
  CPC ....................................................... G03F 1/144
  USPC ............................................................. 716/53
  See application file for complete search history.

(56) References Cited

U.S. PATENT DOCUMENTS

| 7,539,970 | B2 | 5/2009 | Jung et al. |
| 7,650,587 | B2 | 1/2010 | Baum et al. |
| 8,122,391 | B2 | 2/2012 | Chen et al. |
| 8,404,403 | B2 | 3/2013 | Ogadhoh et al. |
| 2011/0320990 | A1* | 12/2011 | Srinivasan .................... 716/102 |
| 2013/0042210 | A1* | 2/2013 | Lu et al. .......................... 716/53 |
| 2015/0067621 | A1* | 3/2015 | Hogan et al. .................. 716/106 |

OTHER PUBLICATIONS

Kuo-Hsun Huang et al., U.S. Appl. No. 14/301,338, filed Jun. 11, 2014.

* cited by examiner

*Primary Examiner* — Suresh Memula
(74) *Attorney, Agent, or Firm* — WPAT, PC; Justin King

(57) ABSTRACT

A verifying method of an optical proximity correction is provided. The verifying method includes the following steps. A first netlist file is extracted from an integrated pre-OPC layout. A first post-OPC layout and a second post-OPC layout are merged to be an integrated post-OPC layout. A second netlist file is extracted from the integrated post-OPC layout. The first netlist file and the second netlist are compared.

10 Claims, 16 Drawing Sheets

VERIFYING METHOD OF OPTICAL PROXIMITY CORRECTION

This application claims the benefit of Taiwan application Serial No. 103131874, filed Sep. 16, 2014, the subject matter of which is incorporated herein by reference.

BACKGROUND

1. Technical Field

The disclosure relates in general to a verifying method, and more particularly to a verifying method of an optical proximity correction.

2. Description of the Related Art

Accompanied with development of the semiconductor technology, an optical proximity correction is developed. In the optical proximity correction, the pattern of the mask can be corrected, such that a pattern obtained from exposing by the corrected mask can satisfy requirements.

However, it is an important trend to reduce the pitch. If the pitch is too small, an exposing interference may occur during an exposing process. Circuit short or circuit open may happen, or some electric characteristics, such as breakdown voltage, may not reach to a predetermined value. Therefore, there is an great challenge to the optical proximity correction.

SUMMARY

The disclosure is directed to a verifying method of the optical proximity correction. A double patterning process is used for preventing an exposing interference during an exposing process and netlist files are used for correctly verifying the electronic functions.

According to a first aspect of the present disclosure, a verifying method of an optical proximity correction is provided. The verifying method includes the following steps. A first netlist file is extracted from an integrated pre-OPC layout. A first post-OPC layout and a second post-OPC layout are merged to be an integrated post-OPC layout. A second netlist file is extracted from the integrated post-OPC layout. The first netlist file and the second netlist are compared.

The above and other aspects of the disclosure will become better understood with regard to the following detailed description of the non-limiting embodiment(s). The following description is made with reference to the accompanying drawings.

DETAILED DESCRIPTION

First Embodiment

Figure 1A:
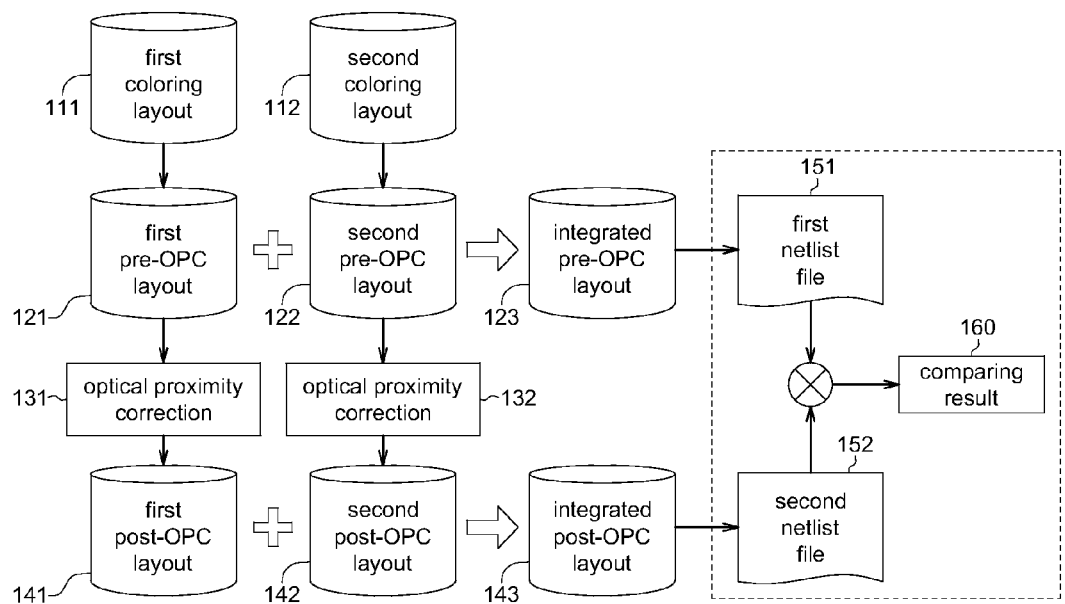
FIG. 1A shows an information transforming diagram of a verifying method of an optical proximity correction according to a first embodiment.
Figure 1B:
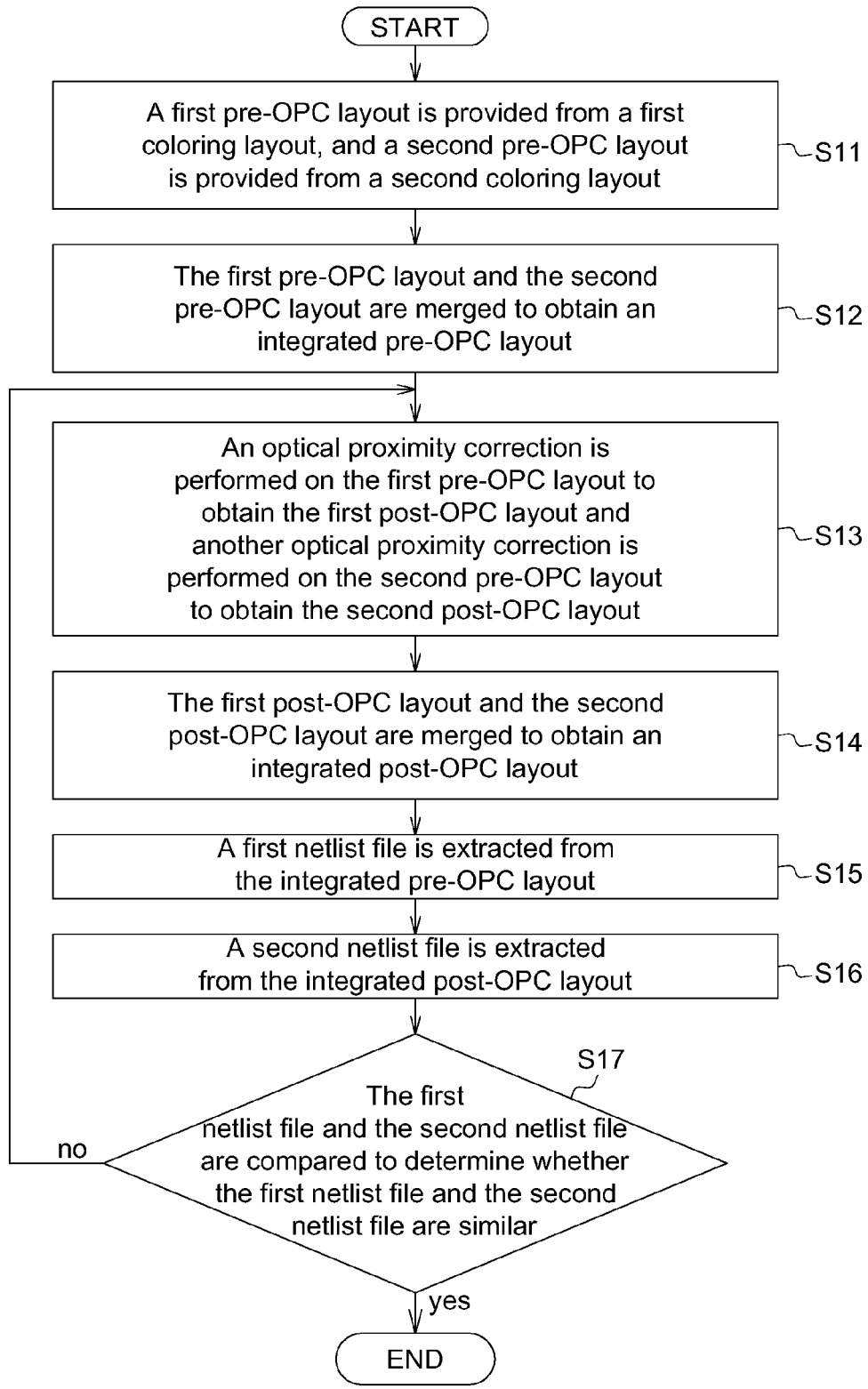
FIG. 1B shows a flowchart of the verifying method of the optical proximity correction according to the first embodiment.
Figure 1C:
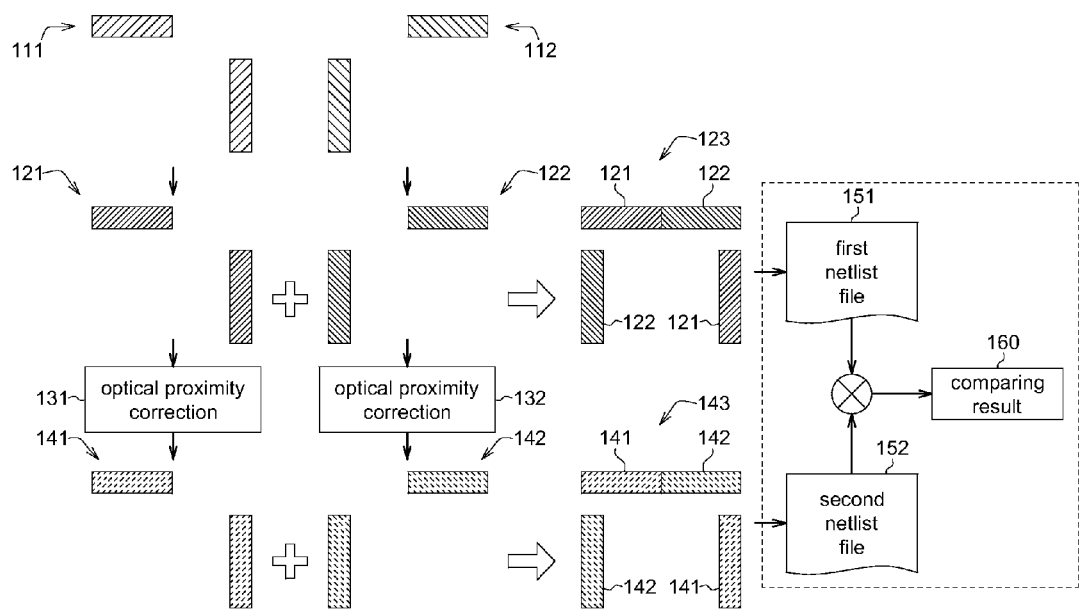
FIG. 1C shows an example of the verifying method of the optical proximity correction according to the first embodiment.

Please referring to FIGS. 1A to 1C, FIG. 1A shows an information transforming diagram of a verifying method of an optical proximity correction according to the first embodiment, FIG. 1B shows a flowchart of the verifying method of the optical proximity correction according to the first embodiment, and FIG. 1C shows an example of the verifying method of the optical proximity correction according to the first embodiment. In the first embodiment, two coloring layouts are used for providing two pre-OPC layouts in a double patterning process, and two netlist files are used for verifying the optical proximity correction.

Firstly, in step S11, a first pre-OPC layout 121 is obtained from a first coloring layout 111, and a second pre-OPC layout 122 is obtained from a second coloring layout 112. For preventing an exposing interference during an exposing process, an original colorless layout can be divided into the first coloring layout 111 and the second coloring layout 112. In the present embodiment, the first coloring layout 111 and the second coloring layout 112 are the information initially provided from the designer.

As shown in FIG. 1C, the first coloring layout 111 is taken as the first pre-OPC layout 121. The second coloring layout 112 is taken as the second pre-OPC layout 122. As such, the minimum pitch can be enlarged for preventing the exposing interference.

In step S12, the first pre-OPC layout 121 and the second pre-OPC layout 122 are merged to obtain an integrated pre-OPC layout 123. In the double patterning process, two masks are used in two exposing processes, such that two exposed patterns can be combined to result a target pattern. As shown in FIG. 1C, the first pre-OPC layout 121 and the second pre-OPC layout 122 are merged to obtain the integrated pre-OPC layout 123. The pitch of the integrated pre-OPC layout 123 can be smaller than the pitch of the first pre-OPC layout 121 and the pitch of the second pre-OPC layout 122. By performing the double patterning process, the exposing interference can be prevented.

In step S13, an optical proximity correction 131 is performed on the first pre-OPC layout 121 to obtain the first post-OPC layout 141 and another optical proximity correction 132 is performed on the second pre-OPC layout 122 to obtain the second post-OPC layout 142. As shown in FIG. 1C, after performing the optical proximity correction 131 on the first pre-OPC layout 121, the first post-OPC layout 141 is obtained. As shown in FIG. 1C, after performing the optical proximity correction 132 on the second pre-OPC layout 122, the second post-OPC layout 142 is obtained.

In step S14, the first post-OPC layout 141 and the second post-OPC layout 142 are merged to obtain an integrated post-OPC layout 143. As shown in FIG. 1C, after performing the optical proximity corrections 131, 132, the integrated post-OPC layout 143 must realize the electronic functions of the original colorless layout which is not performed any optical proximity correction. A verification is performed by comparing some electric characteristics.

In step S15, a first netlist file 151 is extracted from the integrated pre-OPC layout 123. The first netlist file 151 is a file format of an electronic design automation (EDA), which can represent varied electric characteristics.

In step S16, a second netlist file 152 is extracted from the integrated post-OPC layout 143.

In step S17, the first netlist file 151 and the second netlist file 152 are compared to generate a comparing result 160. If the comparing result 160 shows that the electric characteristics of the first netlist file 151 and the second netlist file 152 are similar, then it means that the optical proximity corrections 131, 132 performed during the double patterning process are correctly accomplished and the method terminates. If the comparing result 160 shows that the electric characteristics of the first netlist file 151 and the second netlist file 152 are not similar, then it means that the optical proximity corrections 131, 132 performed during the double patterning process are not correct and the method returns to the step S13 to perform the optical proximity corrections 131, 132 again.

As shown in FIG. 1C, the integrated post-OPC layout 143 and the integrated pre-OPC layout 123 are similar. The comparing result 160 will show that the electric characteristics of the first netlist file 151 and the second netlist file 152 are similar; thus, the method terminates.

Figure 1D:
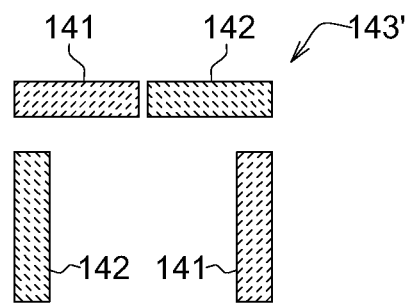
FIG. 1D shows an example of an integrated post-OPC layout.

Please referring to FIG. 1D, FIG. 1D shows an example of another integrated post-OPC layout 143'. The horizontal trace of the integrated post-OPC layout 143' is discontinuous, but the horizontal trace of the integrated pre-OPC layout 123 is continuous. Therefore, the electric characteristics of the integrated post-OPC layout 143' and the integrated pre-OPC layout 123 will not be similar and the method returns to step S13 to perform the optical proximity corrections 131, 132 again.

Base on above, because the optical proximity corrections 131, 132 are verified through the first netlist file 151 and the second netlist file 152, the comparing result 160 can directly show whether the electric functions can be correctly performed. Further, the double patterning process can prevent the exposing interference, such that the pitch can be reduced.

Second Embodiment

Figure 2A:
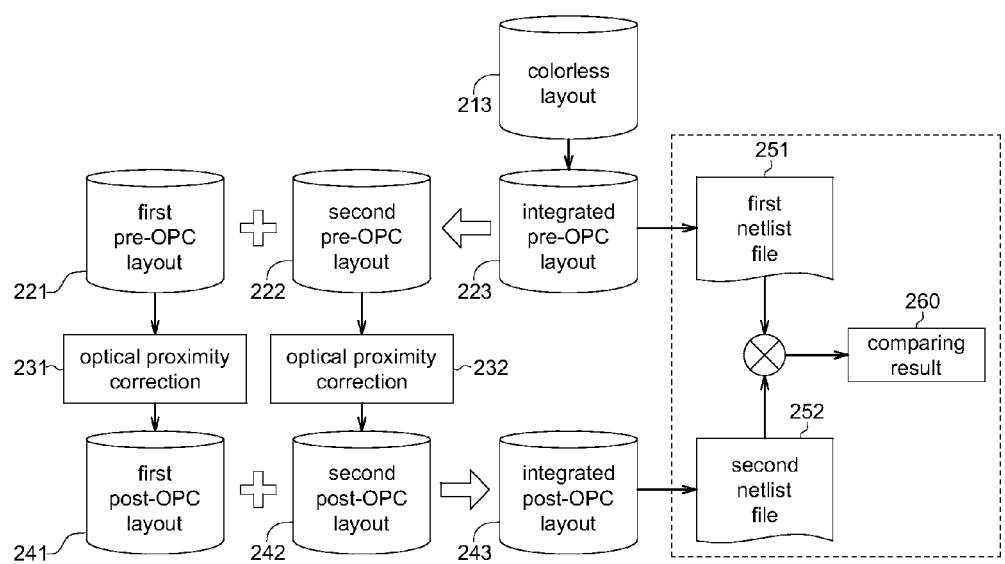
FIG. 2A shows an information transforming diagram of the verifying method of the optical proximity correction according to a second embodiment.
Figure 2B:
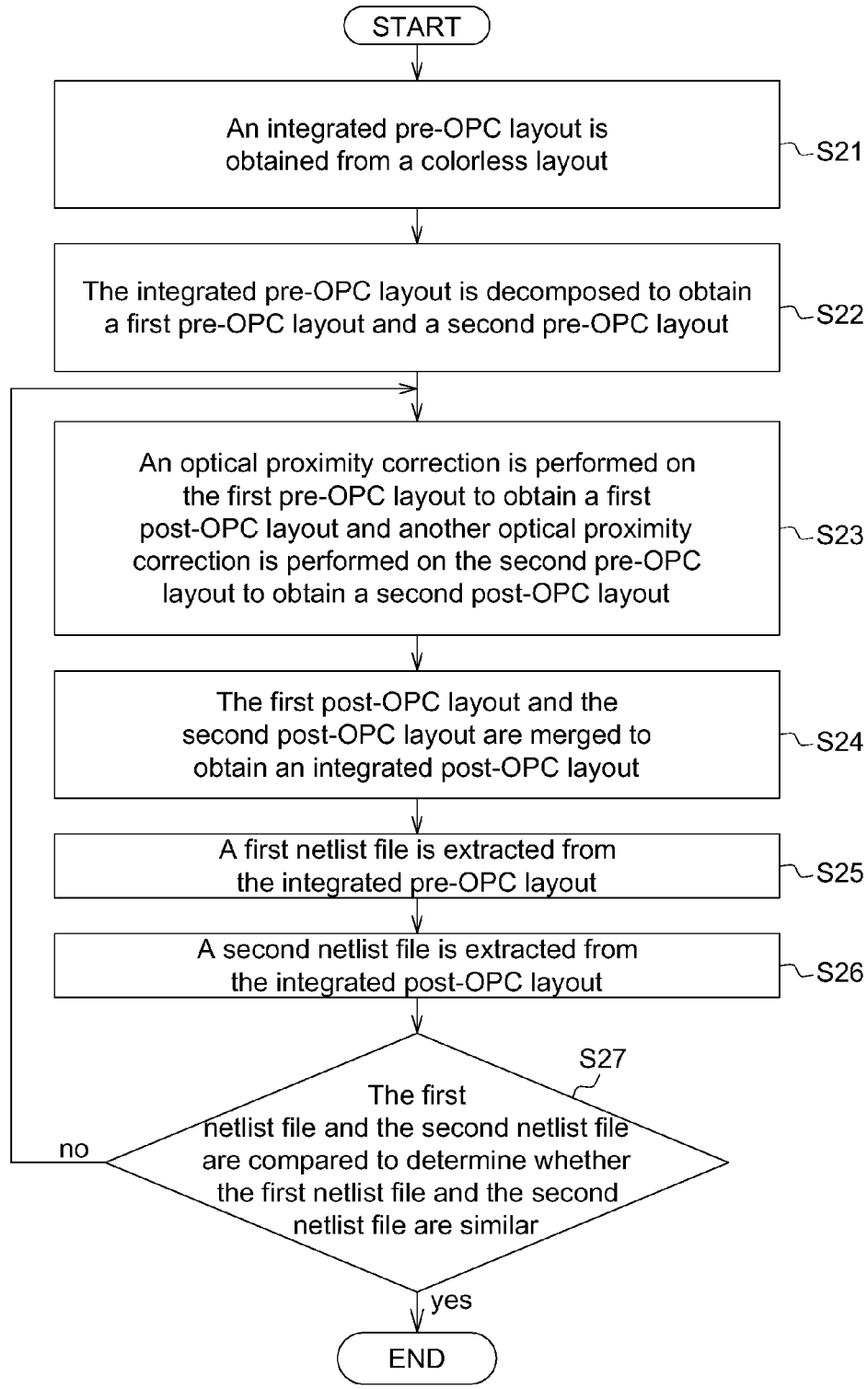
FIG. 2B shows a flow chart of the verifying method of the optical proximity correction according to the second embodiment.
Figure 2C:
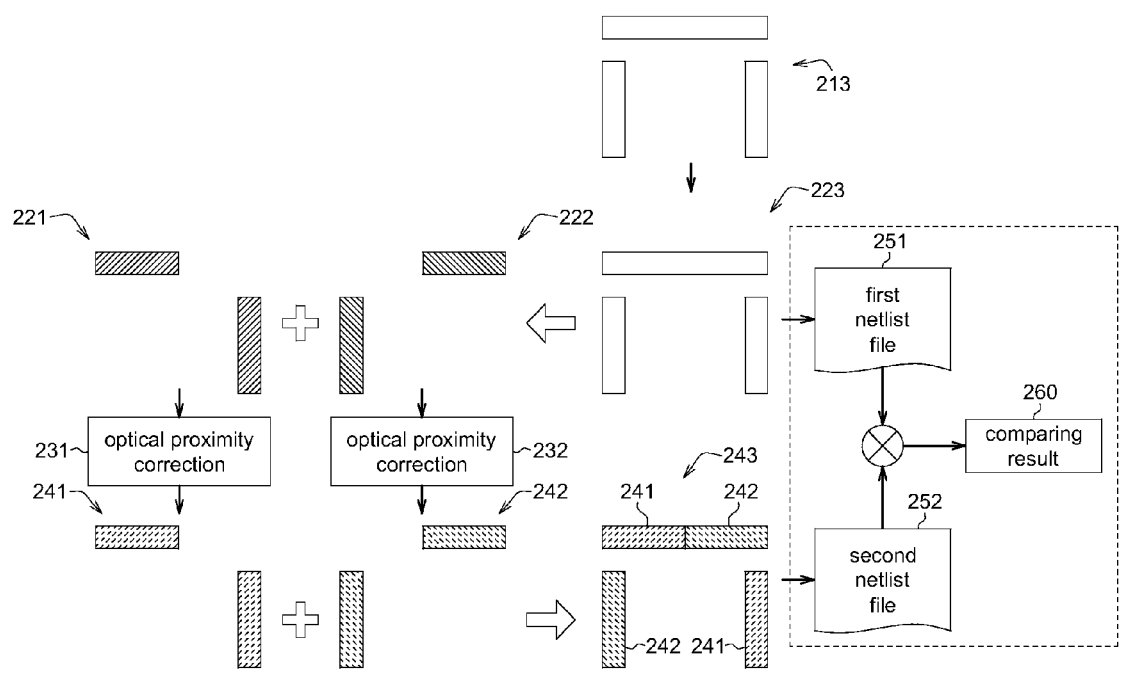
FIG. 2C shows an example of the verifying method of the optical proximity correction according to the second embodiment.

Please referring to FIGS. 2A to 2C, FIG. 2A shows an information transforming diagram of the verifying method of the optical proximity correction according to the second embodiment, FIG. 2B shows a flow chart of the verifying method of the optical proximity correction according to the second embodiment, and FIG. 2C shows an example of the verifying method of the optical proximity correction according to the second embodiment. The verifying method of the optical proximity correction of the present embodiment and the verifying method of the optical proximity correction of the first embodiment are different in that a colorless layout is used for providing two pre-OPC layouts in the double patterning process, other similarities will not be repeated.

In step S21, an integrated pre-OPC layout 223 is obtained from a colorless layout 213. As shown in FIG. 2C, the integrated pre-OPC layout 223 is directly obtained from the colorless layout 213 without any decomposing or composing procedure.

In step S22, the integrated pre-OPC layout 223 is decomposed to obtain a first pre-OPC layout 221 and a second pre-OPC layout 222. In this step, the integrated pre-OPC layout 223 is decomposed according to a way that the pitch can be enlarged for preventing the exposing interference.

In step S23, an optical proximity correction 231 is performed on the first pre-OPC layout 221 to obtain a first post-OPC layout 241 and another optical proximity correction 232 is performed on the second pre-OPC layout 222 to obtain a second post-OPC layout 242.

In step S24, the first post-OPC layout 241 and the second post-OPC layout 242 are merged to obtain an integrated post-OPC layout 243.

In step S25, a first netlist file 251 is extracted from the integrated pre-OPC layout 223.

In step S26, a second netlist file 252 is extracted from the integrated post-OPC layout 243.

In step S27, the first netlist file 251 and the second netlist file 252 are compared to generate a comparing result 260. If the comparing result 260 shows that the electric characteristics of the first netlist file 251 and the second netlist file 252 are similar, then it means that the optical proximity corrections 231, 232 performed during the double patterning process are correctly accomplished and the method terminates. If the comparing result 260 shows that the electric characteristics of the first netlist file 251 and the second netlist file 252 are not similar, then it means that the optical proximity corrections 231, 232 performed during the double patterning process are not correct and the method returns to the step S23 to perform the optical proximity corrections 231, 232 again.

As shown in FIG. 2C, the integrated post-OPC layout 243 and the integrated pre-OPC layout 223 are similar. The comparing result 260 will show that the electric characteristics of the first netlist file 251 and the second netlist file 252 are similar; thus the method terminates.

Figure 2D:
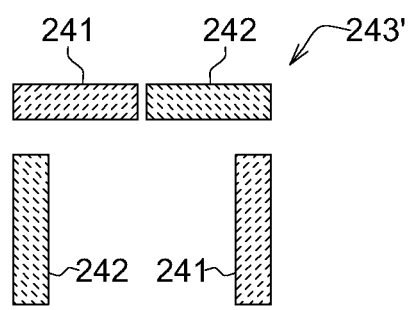
FIG. 2D shows an example of an integrated post-OPC layout.

Please referring to FIG. 2D, FIG. 2D shows an example of another integrated post-OPC layout 243'. The horizontal trace of the integrated post-OPC layout 243' is discontinuous, but the horizontal trace of the integrated pre-OPC layout 223 is continuous. Therefore, the electric characteristics of the integrated post-OPC layout 243' and the integrated pre-OPC layout 223 will not be similar and the method returns to step S23 to perform the optical proximity corrections 231, 232 again.

In another embodiment, if the comparing result 260 shows that the electric characteristics of the integrated post-OPC layout 243' and the integrated pre-OPC layout 223 are not similar, then the method may return to the step S22 to perform the decomposing procedure again. The horizontal trace of the first pre-OPC layout 221 may extend towards the right direction, and the horizontal trace of the second pre-OPC layout 222 may extend towards the left direction. As such, a continuous horizontal trace can be formed in the integrated post-OPC layout 243.

Third Embodiment

Figure 3A:
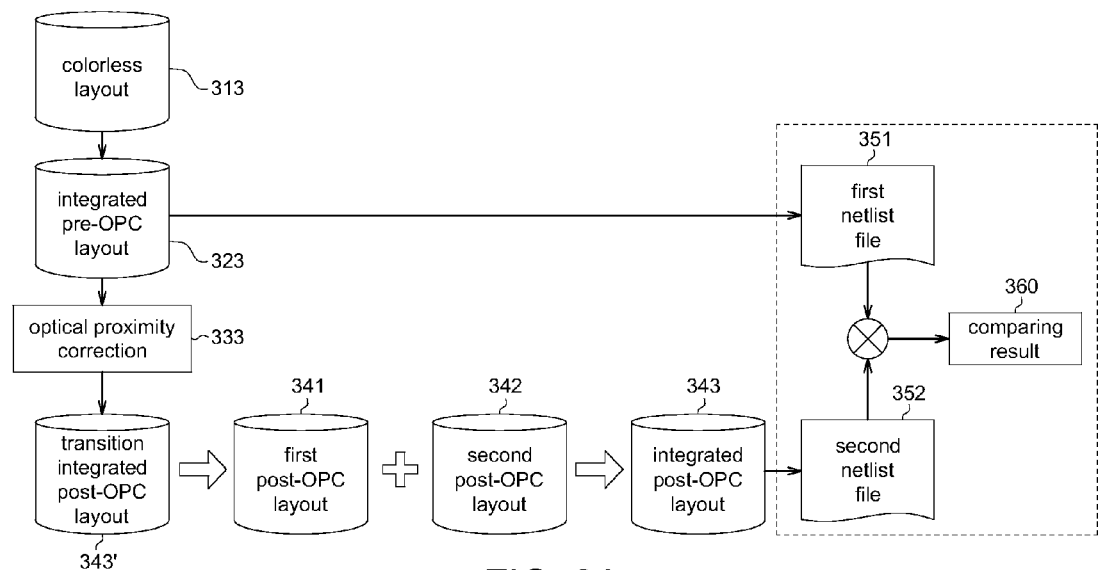
FIG. 3A shows an information transforming diagram of a verifying method of an optical proximity correction according to a third embodiment.
Figure 3B:
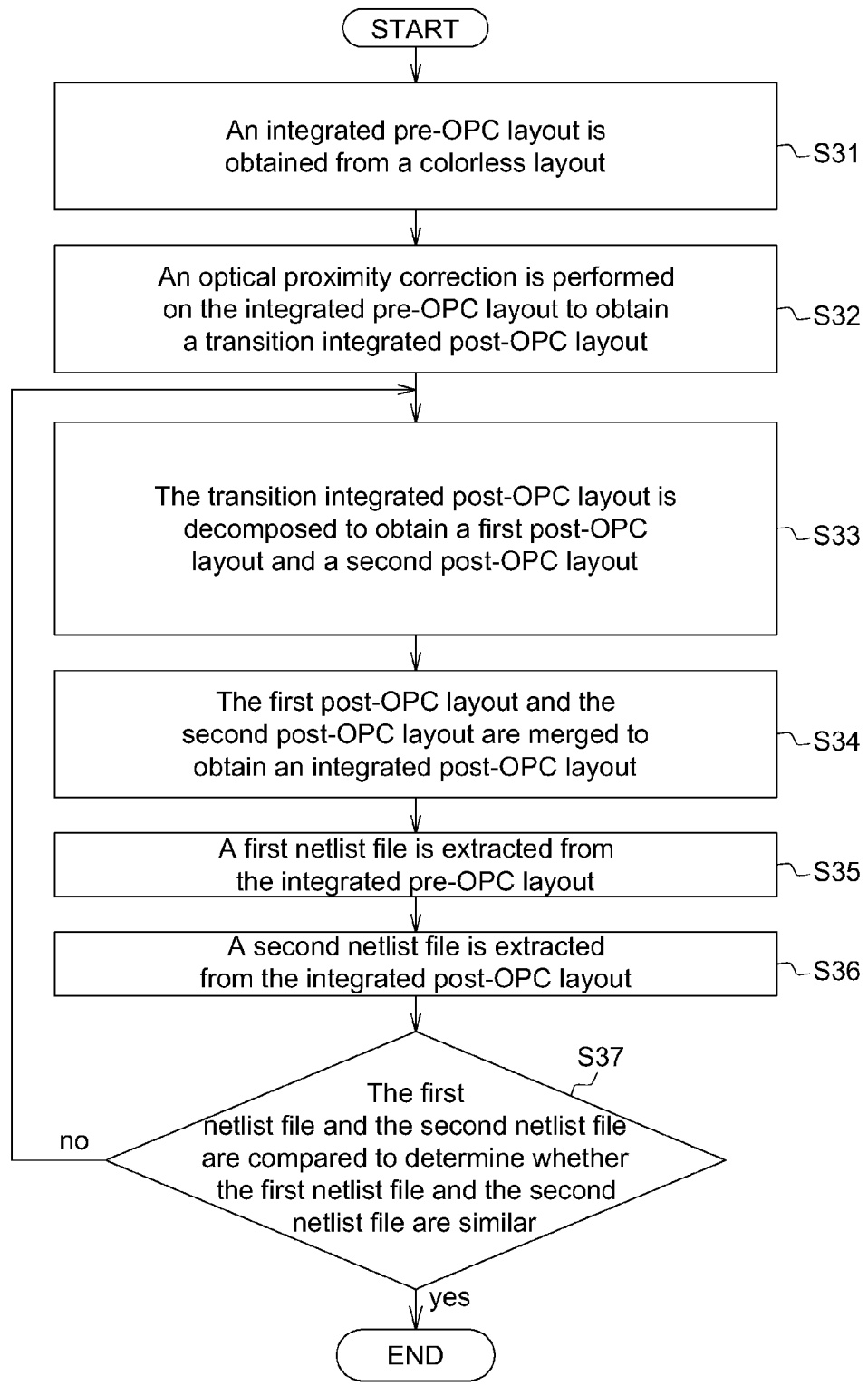
FIG. 3B shows a flowchart of the verifying method of the optical proximity correction according to the third embodiment.
Figure 3C:
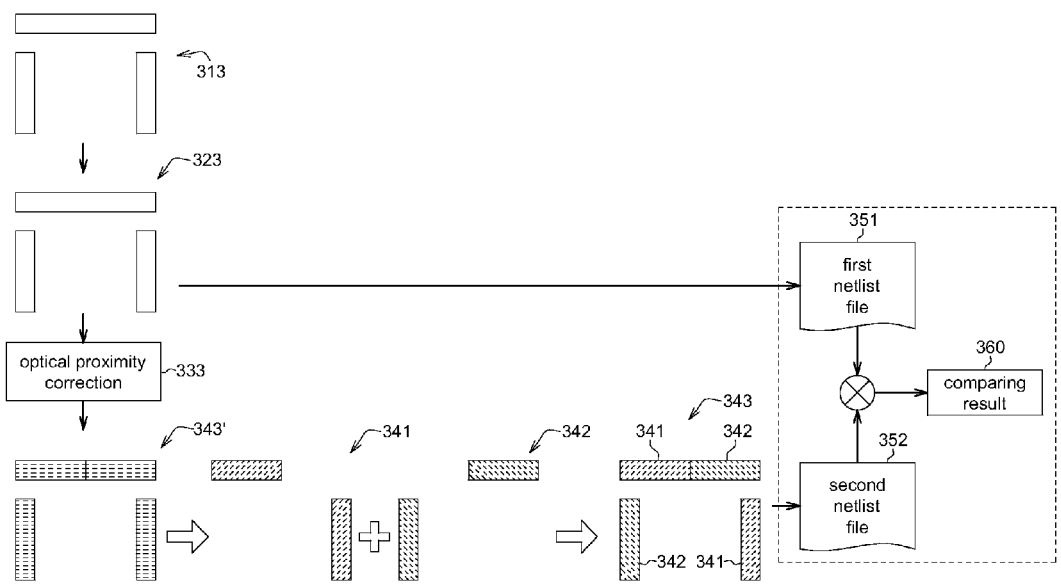
FIG. 3C shows an example of the verifying method of the optical proximity correction according to the third embodiment.

Please referring to FIGS. 3A to 3C, FIG. 3A shows an information transforming diagram of a verifying method of an optical proximity correction according to the third embodiment, FIG. 3B shows a flowchart of the verifying method of the optical proximity correction according to the third embodiment, and FIG. 3C shows an example of the verifying method of the optical proximity correction according to the third embodiment. The verifying method of the optical proximity correction of the present embodiment and the verifying method of the optical proximity correction of the second embodiment are different in that the decomposing procedure is performed after an optical proximity correction 333, other similarities will not be repeated.

In step S31, an integrated pre-OPC layout 323 is obtained from a colorless layout 313. As shown in FIG. 3C, the integrated pre-OPC layout 323 is obtained from the colorless layout 313 without any decomposing or composing procedure.

In step S32, the optical proximity correction 333 is performed on the integrated pre-OPC layout 323 to obtain a transition integrated post-OPC layout 343'.

In step S33, the transition integrated post-OPC layout 343' is decomposed to obtain a first post-OPC layout 341 and a second post-OPC layout 342. This step of decomposing is performed after the optical proximity correction 333. The transition integrated post-OPC layout 343' is decomposed according to a way that the pitch is enlarged for preventing the exposing interference.

In step S34, the first post-OPC layout 341 and the second post-OPC layout 342 are merged to obtain an integrated post-OPC layout 343.

In step S35, a first netlist file 351 is extracted from the integrated pre-OPC layout 323.

In step S36, a second netlist file 352 is extracted from the integrated post-OPC layout 343.

In step S37, the first netlist file 351 and the second netlist file 352 are compared to generate a comparing result 360. If the comparing result 360 shows that the electric characteristics of the first netlist file 351 and the second netlist file 352 are similar, then it means that the decomposing procedure and the optical proximity correction 333 are correctly accomplished and the method terminates. If the comparing result 360 shows that the electric characteristics of the first netlist file 351 and the second netlist file 352 are not similar, then it means that the decomposing procedure and the optical proximity correction 333 are not correctly accomplished and the method returns to the step S32.

As shown in FIG. 3C, the integrated post-OPC layout 343 and the integrated pre-OPC layout 323 are similar. The comparing result 360 will show that the electric characteristics of the first netlist file 351 and the second netlist file 352 are similar; thus, the method terminates.

Figure 3D:
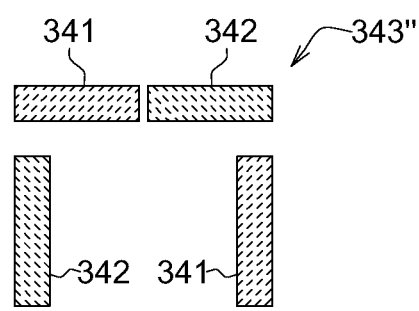
FIG. 3D shows an example of an integrated post-OPC layout.

Please referring to FIG. 3D, FIG. 3D shows an example of another integrated post-OPC layout 343". The horizontal trace of the integrated post-OPC layout 343" is discontinuous, but the horizontal trace of the integrated pre-OPC layout 323 is continuous. Therefore, the electric characteristics of the integrated post-OPC layout 343" and the integrated pre-OPC layout 323 will not be similar and the method returns to step S32 to perform the optical proximity correction 333 again.

In another embodiment, if the comparing result 360 shows that the electric characteristics of the integrated post-OPC layout 343" and the integrated pre-OPC layout 323 are not similar, then the method may return to the step S32 to perform the decomposing procedure again. The horizontal trace of the first post-OPC layout 341 may extend towards the right direction, and the horizontal trace of the second post-OPC layout 342 may extend towards the left direction. As such, a continuous horizontal trace can be formed in the integrated post-OPC layout 343.

Fourth Embodiment

Figure 4A:
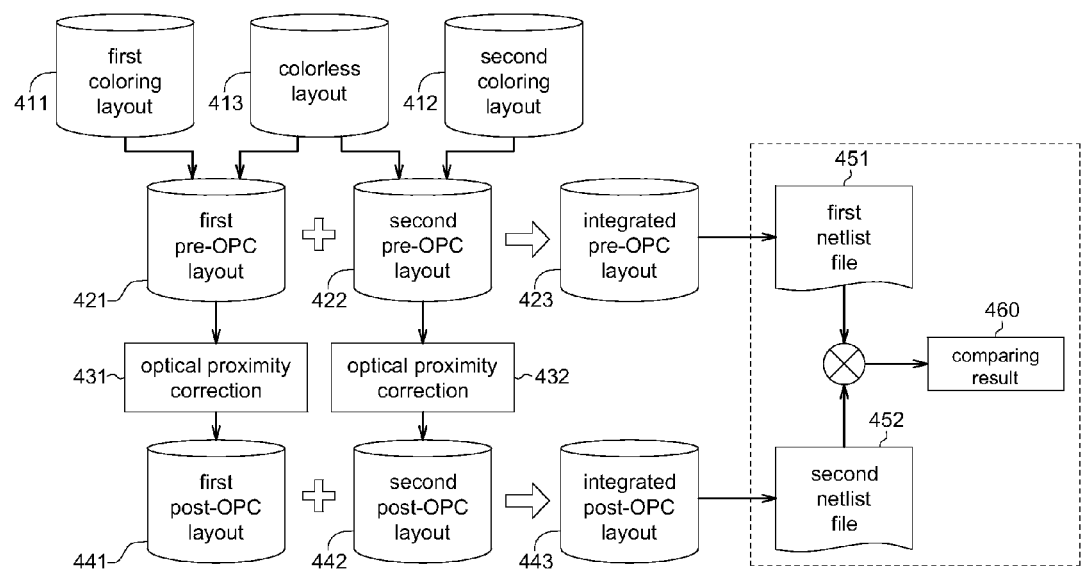
FIG. 4A shows an information transforming diagram of a verifying method of an optical proximity correction according to a fourth embodiment.
Figure 4B:
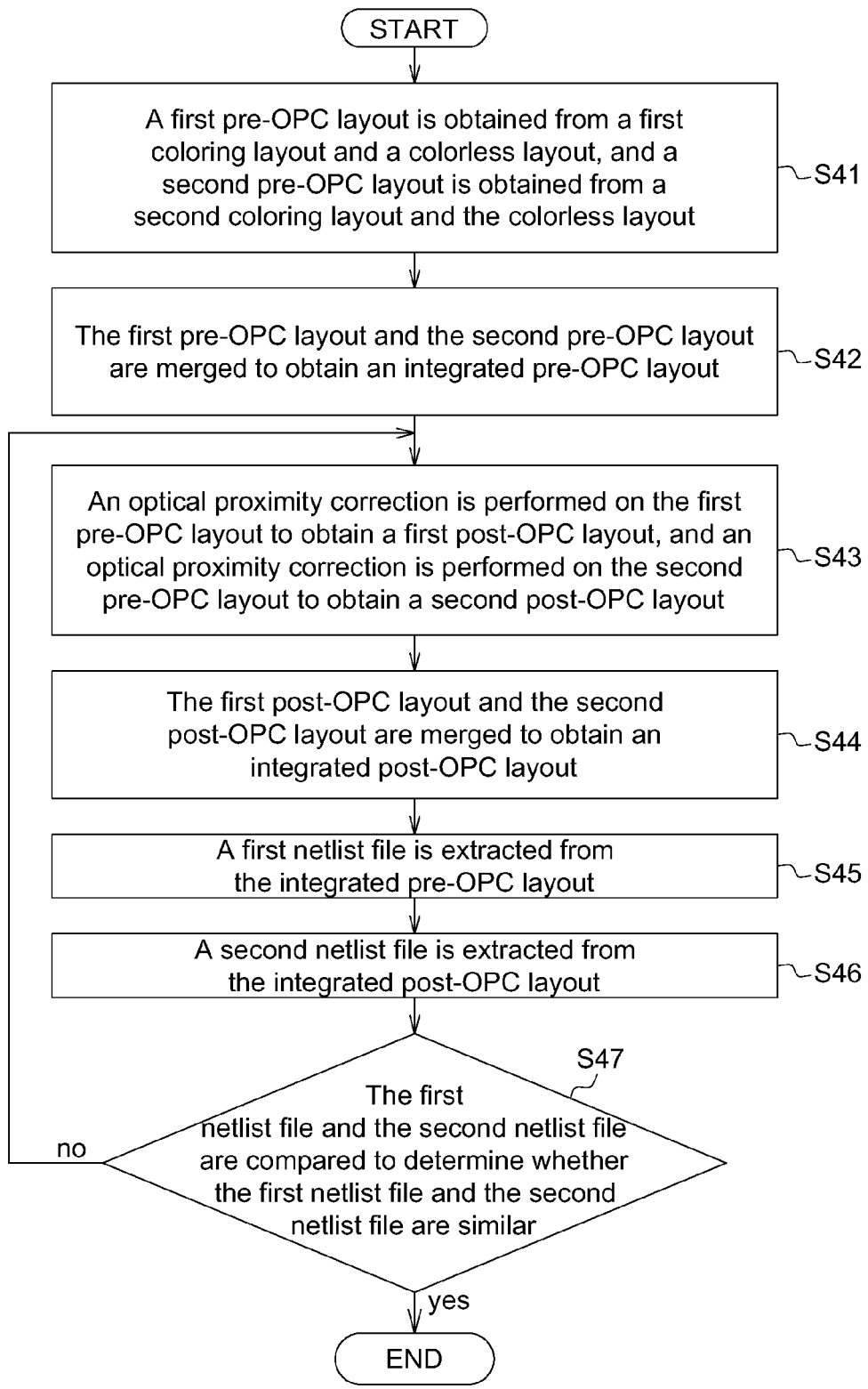
FIG. 4B shows a flowchart of the verifying method of the optical proximity correction according to the fourth embodiment.
Figure 4C:
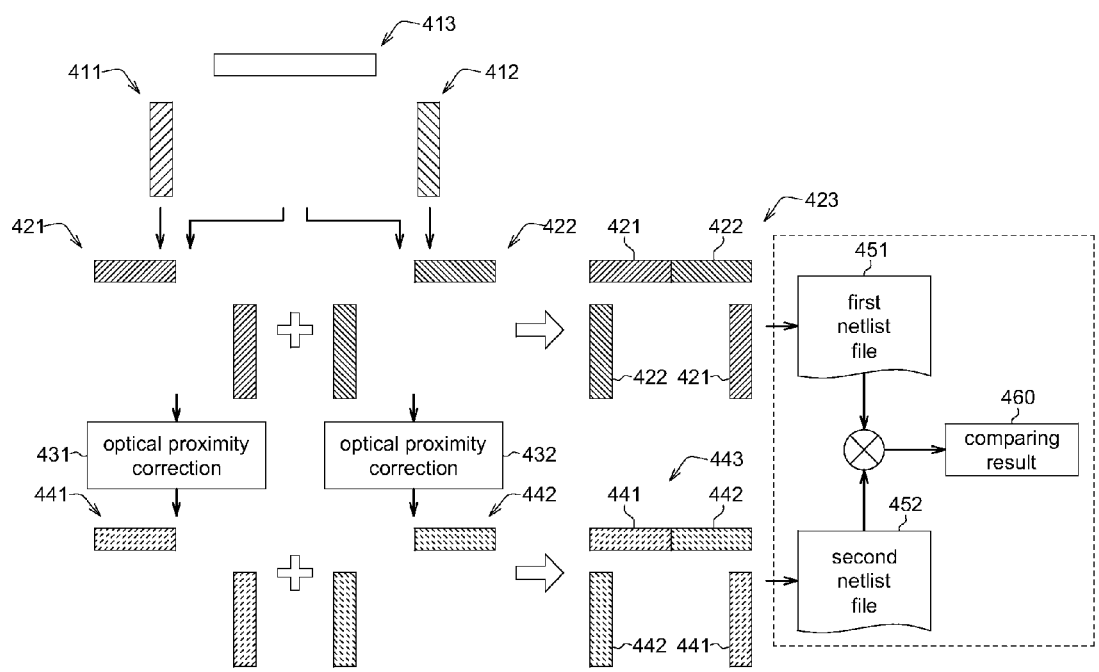
FIG. 4C shows an example of the verifying method of the optical proximity correction according to the fourth embodiment.

Please referring to FIGS. 4A to 4C, FIG. 4A shows an information transforming diagram of a verifying method of an optical proximity correction according to the fourth embodiment, FIG. 4B shows a flowchart of the verifying method of the optical proximity correction according to the fourth embodiment, and FIG. 4C shows an example of the verifying method of the optical proximity correction according to the fourth embodiment. The verifying method of the optical proximity correction of the present embodiment and the verifying method of the optical proximity correction of the first embodiment are different in that two coloring layouts and a colorless layout are used for providing two pre-OPC layouts in the double patterning process, other similarities will not be repeated.

In step S41, a first pre-OPC layout 421 is obtained from a first coloring layout 411 and a colorless layout 413, and a second pre-OPC layout 422 is obtained from a second coloring layout 412 and the colorless layout 413. As shown in FIG. 4C, the colorless layout 413 is decomposed and then distributed to the first pre-OPC layout 421 and the second pre-OPC layout 422.

In step S42, the first pre-OPC layout 421 and the second pre-OPC layout 422 are merged to obtain an integrated pre-OPC layout 423.

In step S43, an optical proximity correction 431 is performed on the first pre-OPC layout 421 to obtain a first post-OPC layout 441, and an optical proximity correction 432 is performed on the second pre-OPC layout 422 to obtain a second post-OPC layout 442.

In step S44, the first post-OPC layout 441 and the second post-OPC layout 442 are merged to obtain an integrated post-OPC layout 443.

In step S45, a first netlist file 451 is extracted from the integrated pre-OPC layout 423.

In step S46, a second netlist file 452 is extracted from the integrated post-OPC layout 443.

In step S47, the first netlist file 451 and the second netlist file 452 are compared to generate a comparing result 460. If the comparing result 460 shows that the electric characteristics of the first netlist file 451 and the second netlist file 452 are similar, then it means that the decomposing procedure and the optical proximity corrections 431, 432 are correctly accomplished and the method terminates. If the comparing result 460 shows that the electric characteristics of the first netlist file 451 and the second netlist file 452 are not similar, then it means that the decomposing procedure and the optical proximity corrections 431, 432 are not correctly accomplished and the method returns to step S43.

As shown in FIG. 4C, the integrated post-OPC layout 443 and the integrated pre-OPC layout 423 are similar. The comparing result 460 will show that the electric characteristics of the first netlist file 451 and the second netlist file 452 are similar; thus, the method terminates.

Figure 4D:
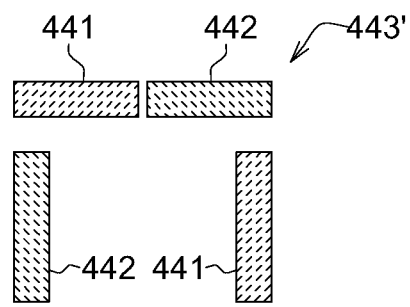
FIG. 4D shows an example of an integrated post-OPC layout.

Please referring to FIG. 4D, FIG. 4D shows an example of another integrated post-OPC layout 443'. The horizontal trace of the integrated post-OPC layout 443' is discontinuous, but the horizontal trace of the integrated pre-OPC layout 423 is continuous. Therefore, the electric characteristics of the integrated post-OPC layout 443' and the integrated pre-OPC layout 423 will not be similar and the method returns to step S42 to perform the optical proximity corrections 431, 432 again.

In another embodiment, if the comparing result 460 shows that the electric characteristics of the integrated post-OPC layout 443' and the integrated pre-OPC layout 423 are not similar, then the method may return to the step S42 to perform the decomposing procedure again. The horizontal trace of the first post-OPC layout 441 may extend towards the right direction, and the horizontal trace of the second post-OPC layout 442 may extend towards the left direction. As such, a continuous horizontal trace can be formed in the integrated post-OPC layout 443.

Base on above, the first netlist file and the second netlist file are used for correctly verifying the electronic functions after performing the optical proximity correction. As such, the electronic functions can be correctly realized. Further, the double patterning process can prevent the exposing interference, such that the pitch can be reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A verifying method of an optical proximity correction (OPC), including:
    extracting, by a netlist processing device, a first netlist file from an integrated pre-OPC layout;
    merging, by a layout processing device, a first post-OPC layout and a second post-OPC layout to be an integrated post-OPC layout;
    extracting, by the netlist processing device, a second netlist file from the integrated post-OPC layout; and
    comparing, by the netlist processing device, the first netlist file and the second netlist file.

2. The verifying method of the optical proximity correction according to claim 1, further comprising:
    providing a first pre-OPC layout and a second pre-OPC layout; and
    merging the first pre-OPC layout and the second pre-OPC layout to be the integrated pre-OPC layout.

3. The verifying method of the optical proximity correction according to claim 2, wherein the first pre-OPC layout is obtained from a first coloring layout, and the second pre-OPC layout is obtained from a second coloring layout.

4. The verifying method of the optical proximity correction according to claim 3, further comprising:
    performing an optical proximity correction on the first pre-OPC layout to obtain the first post-OPC layout, and performing another optical proximity correction on the second pre-OPC layout to obtain the second post-OPC layout.

5. The verifying method of the optical proximity correction according to claim 2, wherein the first pre-OPC layout is obtained from a first coloring layout and a colorless layout, and the second pre-OPC layout is obtained from a second coloring layout and the colorless layout.

6. The verifying method of the optical proximity correction according to claim 5, further comprising:
    performing an optical proximity correction on the first pre-OPC layout to obtain the first post-OPC layout, and performing another optical proximity correction on the second pre-OPC layout to obtain the second post-OPC layout.

7. The verifying method of the optical proximity correction according to claim 1, further comprising:
    decomposing the integrated pre-OPC layout to obtain a first pre-OPC layout and a second pre-OPC layout; and
    performing an optical proximity correction on the first pre-OPC layout to obtain the first post-OPC layout, and performing another optical proximity correction on the second pre-OPC layout to obtain the second post-OPC layout.

8. The verifying method of the optical proximity correction according to claim 7, wherein the integrated pre-OPC layout is obtained from a colorless layout.

9. The verifying method of the optical proximity correction according to claim 1, further comprising:
    performing an optical proximity correction on the integrated pre-OPC layout to obtain a transition integrated post-OPC layout; and
    decomposing the transition integrated post-OPC layout to obtain the first post-OPC layout and the second post-OPC layout.

10. The verifying method of the optical proximity correction according to claim 9, wherein the integrated pre-OPC layout is obtained from a colorless layout.

* * * * *